(12) United States Patent
Kim

(10) Patent No.: US 12,557,286 B2
(45) Date of Patent: Feb. 17, 2026

(54) SEMICONDUCTOR DEVICE AND MANUFACTURING METHOD OF SEMICONDUCTOR DEVICE

(71) Applicant: SK hynix Inc., Gyeonggi-do (KR)

(72) Inventor: Jung Hyeong Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 549 days.

(21) Appl. No.: 18/078,507

(22) Filed: Dec. 9, 2022

(65) Prior Publication Data

US 2024/0074186 A1 Feb. 29, 2024

(30) Foreign Application Priority Data

Aug. 26, 2022 (KR) ........................ 10-2022-0107544

(51) Int. Cl.
*H10B 43/27* (2023.01)
*H10B 41/27* (2023.01)

(52) U.S. Cl.
CPC ............. *H10B 43/27* (2023.02); *H10B 41/27* (2023.02)

(58) Field of Classification Search
CPC ................................ H10B 43/27; H10B 43/20
See application file for complete search history.

(56) References Cited

U.S. PATENT DOCUMENTS

| 10,748,927 B1 | 8/2020 | Tsutsumi et al. | |
| 2011/0012189 A1* | 1/2011 | Jeong | H10B 43/20 257/324 |
| 2014/0239366 A1* | 8/2014 | Izumida | H10B 41/30 257/316 |
| 2018/0175054 A1* | 6/2018 | Baraskar | H10B 43/10 |
| 2020/0251489 A1* | 8/2020 | Tsutsumi | H10B 41/35 |
| 2021/0118989 A1* | 4/2021 | Liu | H10B 43/27 |

FOREIGN PATENT DOCUMENTS

KR 10-1812260 B1 12/2017

* cited by examiner

*Primary Examiner* — Christopher A Johnson
(74) *Attorney, Agent, or Firm* — IP & T GROUP LLP

(57) ABSTRACT

A semiconductor device may include a gate structure including a first conductive layer, a second conductive layer, and a third conductive layer, the third conductive layer being disposed between the first conductive layer and the second conductive layer and thicker than the first conductive layer and the second conductive layer, channel structures passing through the gate structure, and an isolation structure including a first portion passing through the second conductive layer and extended into the channel structures and a second portion protruding from the first portion into the third conductive layer and disposed between the channel structures.

19 Claims, 27 Drawing Sheets

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119 to Korean Patent Application No. 10-2022-0107544 filed on Aug. 26, 2022, which is incorporated herein by reference in its entirety.

BACKGROUND

1. Technical Field

Various Embodiments of the present invention disclosure relate generally to an electronic device and, more particularly, to a semiconductor device and a manufacturing method of a semiconductor device.

2. Related Art

The degree of integration of semiconductor devices is mainly determined by the area occupied by each memory cell. Recently, further improvements in the degree of integration of semiconductor devices employing memory cells in a single layer on a substrate have become rather almost impossible. Hence, many have proposed three-dimensional semiconductor devices which stack the memory cells over a substrate in various three-dimensional arrangements. Such three-dimensional semiconductor devices are, thus, relatively new and a lot of research and development efforts are presently focused on improving their operational reliability, processing characteristics, structure, and manufacturing methods.

SUMMARY

Various embodiments of the present invention, provide an improved three-dimensional semiconductor device with enhanced processing characteristics, and more reliable structure. Various embodiments of the present invention, also provide an improved method of manufacturing the semiconductor device.

In an embodiment, a semiconductor device may include: a gate structure including a first conductive layer, at least one second conductive layer, and a third conductive layer disposed between the first conductive layer and the second conductive layer and thicker than the first conductive layer and the second conductive layer; channel structures passing through the gate structure; and an isolation structure including a first portion passing through the second conductive layer and extended into the channel structures and a second portion protruding from the first portion into the third conductive layer and disposed between the channel structures.

In an embodiment, a semiconductor device may include: a gate structure including a first conductive layer, at least one second conductive layer, and a third conductive layer disposed between the first conductive layer and the second conductive layer and thicker than the first conductive layer and the second conductive layer; a channel structure passing through the gate structure and including an etched surface; and an isolation structure including an insulating spacer passing through the second conductive layer and surrounding the etched surface and an insulating pattern formed in the insulating spacer and passing through the third conductive layer.

In an embodiment, a manufacturing method of a semiconductor device may include: forming a gate structure including a first conductive layer, at least one second conductive layer, and a third conductive layer disposed between the first conductive layer and the second conductive layer and thicker than the first conductive layer and the second conductive layer step; forming a trench passing through the second conductive layer and exposing the third conductive layer; forming an insulating spacer for exposing the third conductive layer in the trench; etching the third conductive layer by using the insulating spacer as an etch barrier; and forming an isolation structure in the trench.

In an embodiment, a manufacturing method of a semiconductor device may include: forming a stack including first material layers and second material layers that are alternately stacked; forming channel structures passing through the stack; forming a first trench by etching the stack and the channel structures; forming a second trench by selectively etching the first material layer exposed on a bottom surface of the first trench; and forming an isolation structure in the first trench and the second trench.

In an embodiment, a semiconductor device may include: a gate structure including at least one first conductive layer, at least one second conductive layer, and a third conductive layer, the third conductive layer being disposed between the at least one first conductive layer and the at least one second conductive layer, wherein the third conductive layer is thicker than each of the at least first conductive layer and the at least second conductive layer; a plurality of channel structures spaced apart from each other and passing through the gate structure; and an isolation structure formed between at least two adjacent channel structures, the isolation structure including a first portion passing through the at least one second conductive layer and extended into the at least two adjacent channel structures and a second portion protruding from a bottom surface of the first portion into the third conductive layer and disposed in its entirety between the at least two channel structures without extending into the at least two channel structures.

These and other features and advantages of the present invention will become apparent to the skilled person from the following figures and detailed description of example embodiments of the present invention.

DETAILED DESCRIPTION

Various embodiments are directed to a semiconductor device having a stable structure and improved characteristics and a manufacturing method thereof.

By stacking memory cells in three dimensions, it is possible to improve the degree of integration of a semiconductor device. Furthermore, it is possible to provide a semiconductor device having a stable structure and improved reliability.

Hereafter, embodiments in accordance with the technical spirit of the present invention disclosure will be described with reference to the accompanying drawings.

Figure 1A:
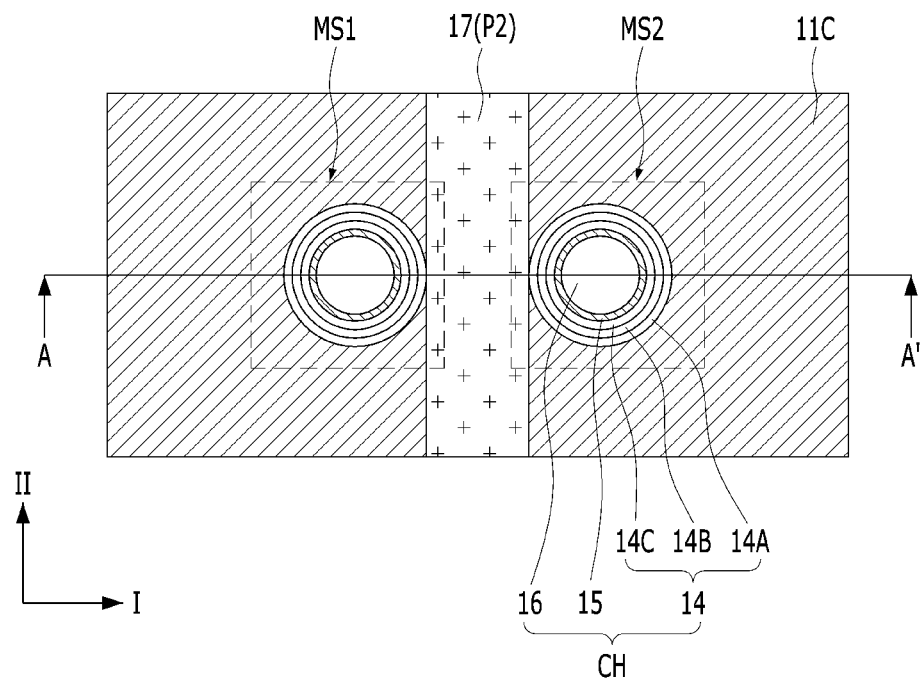
FIG. 1A to FIG. 1D are diagrams illustrating the structure of a semiconductor device in accordance with an embodiment of the present invention disclosure.
Figure 1B:
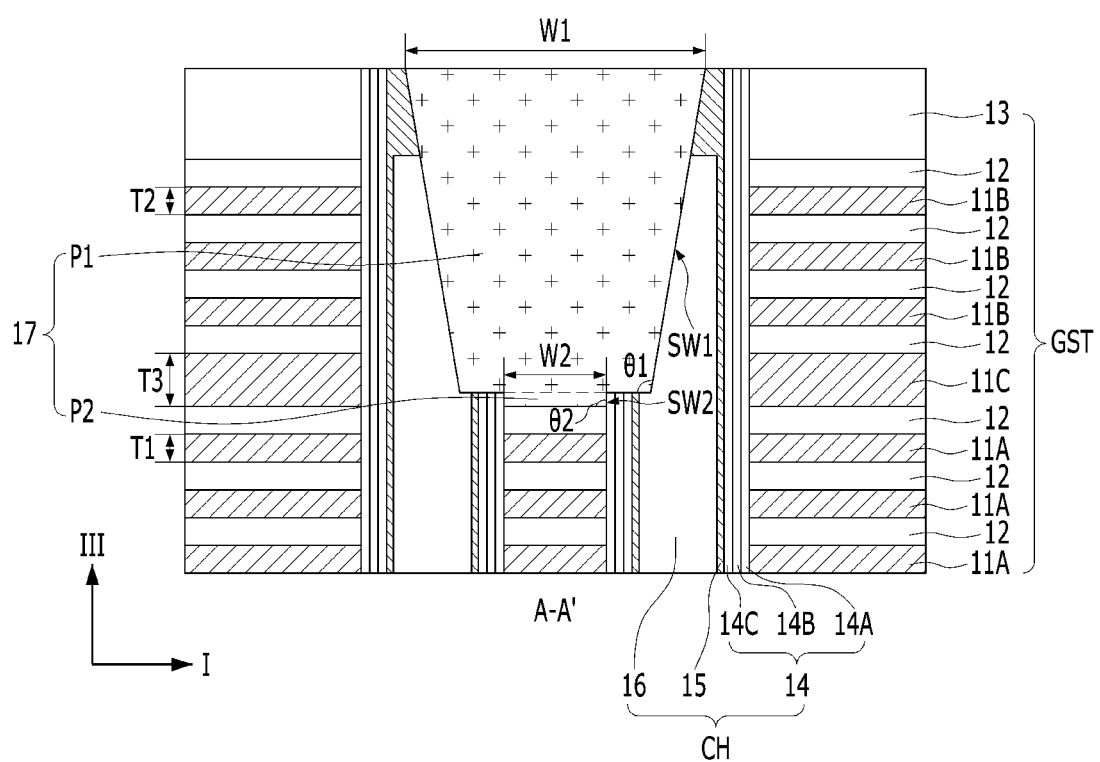
Figure 1C:
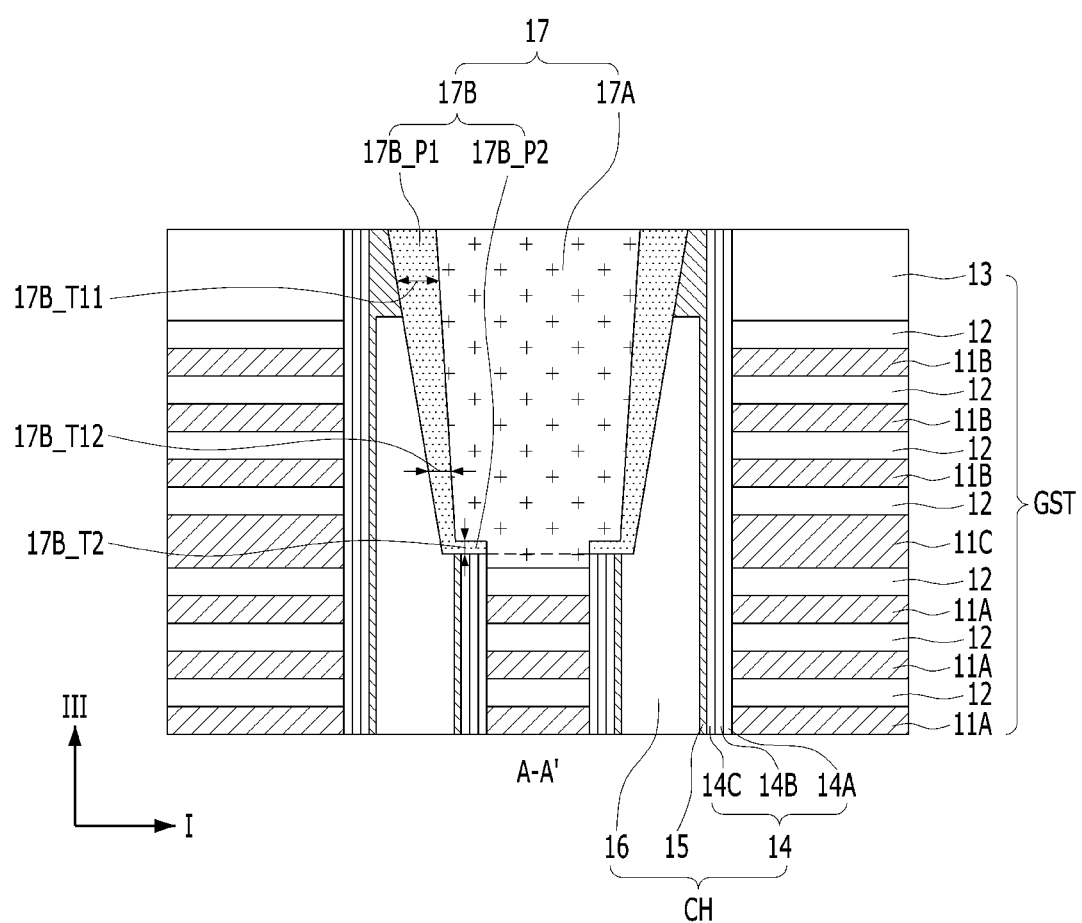
Figure 1D:
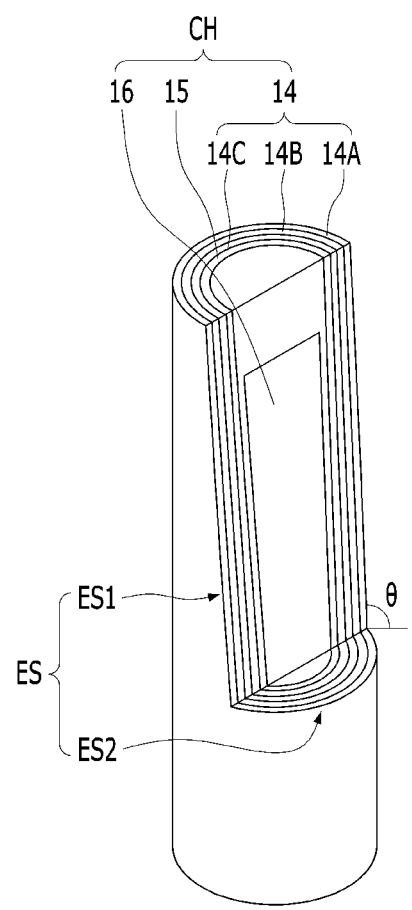

FIG. 1A to FIG. 1D are diagrams illustrating the structure of a semiconductor device in accordance with an embodiment of the present invention disclosure. FIG. 1A is a plan view and FIG. 1B and FIG. 1C are cross-sectional views taken along line A-A' in FIG. 1A. FIG. 1D is a perspective view of a channel structure CH of FIG. 1A.

Referring to FIG. 1A to FIG. 1D, the semiconductor device may include a gate structure GST, channel structures CH, an isolation structure 17, or combination thereof.

The gate structure GST may include first, second and third conductive layers 11A, 11B, and 11C spaced apart from each other, with the third conductive layer 11C being disposed between the first conductive layer 11A and the second conductive layer 11B. The first conductive layer 11A, the second conductive layer 11B, and the third conductive layer 11C may have the same or substantially the same thickness or different thicknesses. In an embodiment, the first conductive layer 11A may have a first thickness T1, and the second conductive layer 11B may have a second thickness T2 that is the same or substantially the same as or different from the first thickness T1. The third conductive layer 11C may be greater than the first thickness T1, may be greater than the second thickness T2, or may have a third thickness T3 greater than both of those of the first thickness T1 and the second thickness T2. When the third conductive layer 11C has a relatively large thickness, the third conductive layer 11C may be used as an etch stop layer during a manufacturing process.

The gate structure GST may further include insulating layers 12. In an embodiment, the gate structure GST may include the conductive layers 11A to 11C and the insulating layers 12 that are alternately stacked, and may further include a hard mask layer 13 disposed on the conductive layers 11A to 11C and the insulating layers 12. The conductive layers 11A to 11C may include at least one first conductive layer 11A, at least one second conductive layer 11B, and at least one third conductive layer 11C. The first conductive layer 11A may be a word line, and the second conductive layer 11B may be a select line. The third conductive layer 11C may be a word line or a select line. For example, the third conductive layer 11C may also be a dummy word line or a dummy select line.

The channel structures CH may pass through the gate structure GST. The channel structures CH may be arranged in a first direction I or a second direction II intersecting the first direction I, or may be arranged in a matrix form. In the present embodiment, the centers of the channel structures CH adjacent in the first direction I are illustrated to lie on the same straight line which is parallel to the first direction I; however, the centers of the channel structures CH may not lie on the same straight line which is parallel to the first direction I. The channel structures CH may pass through the gate structure GST in a third direction III. The third direction III may be a direction protruding from a plane defined by the first direction I and the second direction II. For example, the third direction III may be a direction protruding perpendicularly from the plane defined by the first direction I and the second direction II.

Each of the channel structures CH may include a channel layer 15. The channel layer 15 may include a semiconductor material such as silicon, germanium, or a nano structure. Each of the channel structures CH may further include a memory layer 14 or an insulating core 16, or a combination thereof. The memory layer 14 may include a blocking layer 14A, a data storage layer 14B, a tunneling layer 14C, or a combination thereof. The data storage layer 14B may include a floating gate, polysilicon, a charge trap material, nitride, a variable resistance material, or the like.

A memory cell or a select transistor may be disposed in a region where the channel structures CH and the conductive layers 11A to 11C intersect each other. In an embodiment, the memory cell may be disposed in a region where the channel structure CH and the first conductive layer 11A intersect each other, and a select transistor may be disposed in a region where the channel structure CH and the second conductive layer 11B intersect each other. The memory cell or the select transistor may be disposed in a region where the channel structure CH and the third conductive layer 11C intersect each other. Memory cells and select transistors sharing the same channel layer 15 may constitute one memory string MS1 or MS2.

For example, the semiconductor device may include electrode structures instead of the channel structures CH. The electrode structures may pass through the gate structure GST and may be electrically connected to a bit line. The electrode structure may include an electrode layer passing through the gate structure GST, and may further include a memory layer surrounding an outer wall or an inner wall of the electrode layer. The memory layer may include a variable resistance material.

Each of the channel structures CH may have a shape in which a portion thereof is etched to expose an inner layer thereof. Referring to FIG. 1D, each of the channel structures CH may include an etched surface ES. The etched surface ES may be a cross-section formed by etching the channel structure CH in the process of forming an isolation structure 17. The insulating core 16, the channel layer 15, or the memory layer 14 may be exposed through the etched surface ES. Each of the channel structures CH including the etched surface ES may have a dummy channel structure or a real channel structure. In the case of the real channel structure, the channel structure CH including the etched surface ES may serve as one memory string MS1 or MS2, while a transistor including the etched surface ES may normally operate as a select transistor or a memory cell. For example, among the channel structures CH, a channel structure CH adjacent to the isolation structure 17 may include the etched surface ES, while each of the remaining channel structures CH may not include an etched surface ES.

The shape, area, and the like of the etched surface ES may be changed according to the etched shape of the channel structure CH. The etched surface ES may include a first etched surface ES1 and a second etched surface ES2. An area of the second etched surface ES2 may increase or decrease according to an angle θ of the first etched surface ES1, or the second etch surface ES2 may not exist. The first etched surface ES1 may face a first sidewall SW1 of a first portion P1 of the isolation structure 17.

The isolation structure 17 may be disposed in the gate structure GST. The isolation structure 17 may be used to isolate one or more conductive layers that are the uppermost layers of the conductive layers 11A to 11C. The isolation structure 17 may extend in the second direction II. The isolation structure 17 may have a depth by which the second conductive layer 11B and the third conductive layer 11C corresponding to select lines among the conductive layers 11A to 11C are passed through. In an embodiment, the second conductive layer 11B may be separated into a first select line of a first memory string MS1 and a second select line of a second memory string MS2 by the isolation structure 17. The third conductive layer 11C may be separated into the first select line of the first memory string MS1 and the second select line of the second memory string MS2 by the isolation structure 17. In an embodiment, first select lines connected to the first memory string MS1 may be electrically connected to each other, and the same bias may be applied to the first select lines during operation. Second select lines connected to the second memory string MS2 may be electrically connected to each other, and the same bias may be applied to the second select lines during operation.

The isolation structure 17 may have a uniform width or may have a variable width changing, for example, gradually along its extent. Referring to FIG. 1B, the isolation structure 17 may include the first portion P1 and a second portion P2. The second portion P2 may be connected to the first portion P1. In an embodiment, the second portion P2 may protrude from a bottom surface of the first portion P1. The first portion P1 may have a uniform width or may have a variable width. At an interface between the first portion P1 and the second portion P2, the first portion P1 and the second portion P2 may have the same or substantially the same width (W1=W2) or may have different widths. In an embodiment, the second portion P2 may have a narrower width (W2<W1) than the first portion P1. The first portion P1 may have the first sidewall SW1 and the second portion P2 may have a second sidewall SW2. The first sidewall SW1 and the second sidewall SW2 may have the same or substantially the same inclination ($\theta 1=\theta 2$) or different inclinations ($\theta 1\neq\theta 2$).

The first portion P1 may pass through the second conductive layers 11B and may extend into the channel structures CH. The first portion P1 may also extend into the third conductive layer 11C. In an embodiment, the bottom surface of the first portion P1 may be disposed in the third conductive layer 11C. The first portion P1 may be in contact with the etched surfaces ES of the channel structures CH. For example, the first portion P1 may be in contact with the memory layer 14, the channel layer 15, or the insulating core 16 exposed by the etched surface ES. The second portion P2 may protrude from the first portion P1 into the third conductive layer 11C. The second portion P2 may not extend into the channel structures CH but may only be disposed between the channel structures CH. In an embodiment, a bottom surface of the second portion P2 may be disposed on the same or substantially the same plane as a bottom surface of the third conductive layer 11C.

The isolation structure 17 may be a single layer or a multilayer layer. Referring to FIG. 1C, the isolation structure 17 may include an insulating pattern 17A and an insulating spacer 17B. The insulating pattern 17A may be formed in the insulating spacer 17B and may pass through the second conductive layer 11B and the third conductive layer 11C. The insulating spacer 17B may be disposed between the insulating pattern 17A and the channel structure CH. The insulating spacer 17B may surround the etched surfaces ES of the channel structures CH.

The insulating spacer 17B may include a first portion 17B_P1 and a second portion 17B_P2. The first portion 17B_P1 may surround the first etched surface ES1 and may be in contact with the memory layer 14, the channel layer 15, or the insulating core 16 exposed through the first etched surface ES1. The second portion 17B_P2 may be connected to the first portion 17B_P1. The second portion 17B_P2 may surround the second etched surface ES2 and may be in contact with the memory layer 14, the channel layer 15, or the insulating core 16 exposed through the second etched surface ES2.

The insulating spacer 17B may have a uniform width or may have a variable width changing, for example, gradually along its extent. In an embodiment, the second portion 17B_P2 may have a smaller thickness (17B_T2<17B_T11 and 17B_T12) than the first portion 17B_P1. In the first portion 17B_P1, the thickness may decrease in a direction from a top surface thereof to a bottom surface thereof. Hence, in the first portion 17B_P1, a lower portion may have a smaller thickness (17B12<17B_T11) than an upper portion.

According to the structure described above, the third conductive layer 11C may have a greater thickness than the second conductive layer 11B. Accordingly, when the isolation structure 17 is formed, the third conductive layer 11C may be used as an etch stop layer, and the isolation structures 17 may have a uniform depth.

Furthermore, the isolation structure 17 may include the first portion P1 and the second portion P2, and the second portion P2 may protrude into the third conductive layer 11C. Due to the second portion P2, the bottom surface of the isolation structure 17 may have a stepped cross-section, and the area of the bottom surface may be increased. Accordingly, it is possible to minimize or prevent inclusion of voids in the isolation structure 17. In addition, it is possible to prevent damage to a peripheral layer due to residual gas in the voids.

Figure 2A:
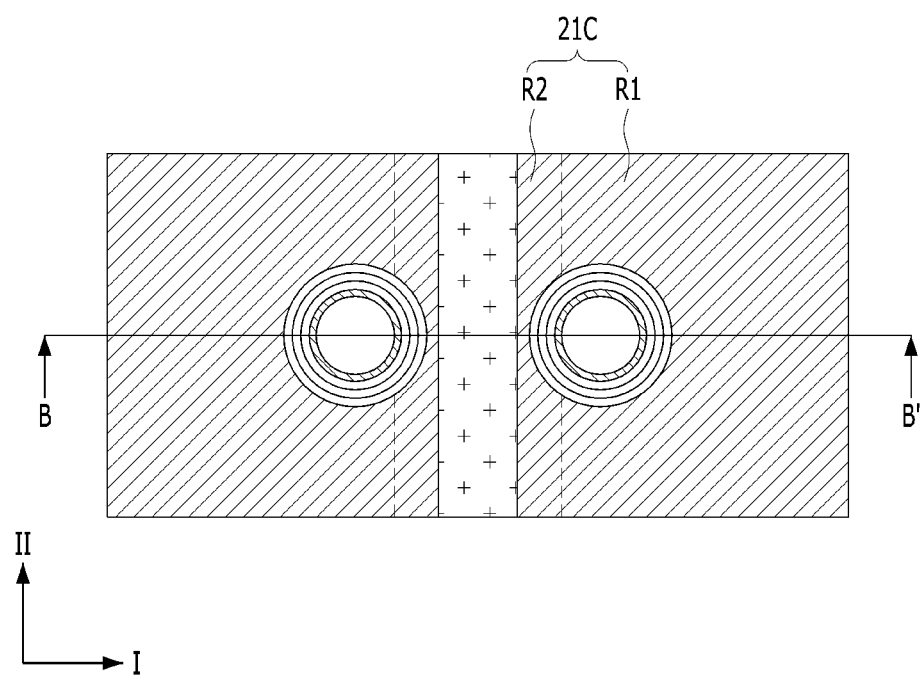
FIG. 2A to FIG. 2C are diagrams illustrating the structure of a semiconductor device in accordance with an embodiment of the present invention disclosure.
Figure 2B:
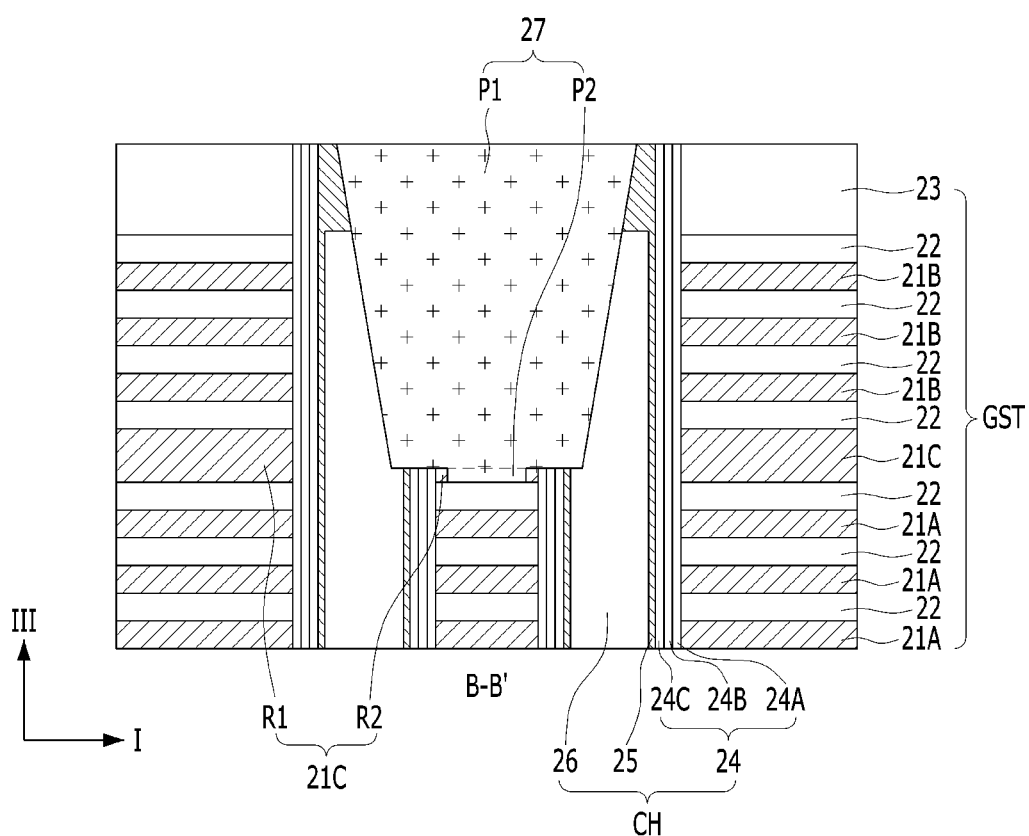
Figure 2C:
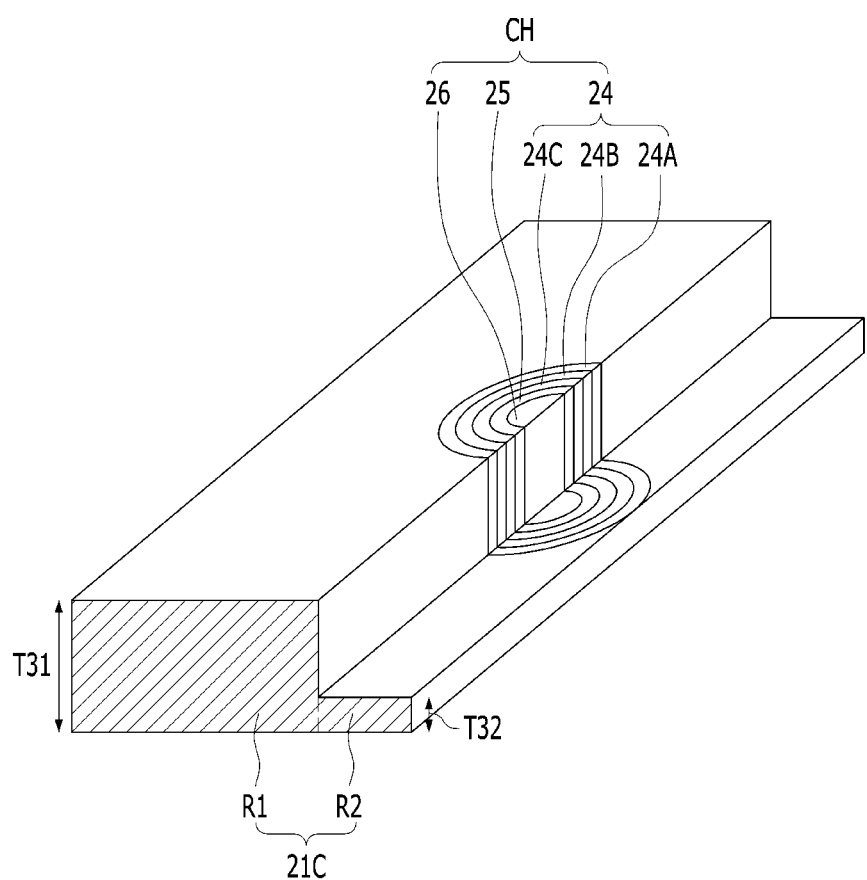

FIG. 2A to FIG. 2C are diagrams illustrating the structure of a semiconductor device according to an embodiment. FIG. 2A is a plan view, and FIG. 2B is a cross-sectional view taken along line B-B' in FIG. 2A. FIG. 2C is a perspective view of a third conductive layer 21C. Hereinafter, content already described earlier may be omitted.

Referring to FIG. 2A to FIG. 2C, the semiconductor device may include a gate structure GST, channel structures CH, an isolation structure 27, or a combination thereof. The gate structure GST may include at least one first conductive layer 21A, at least one second conductive layer 21B, and third conductive layer 21C disposed between the first conductive layer 21A and the second conductive layer 21B. In an embodiment, the gate structure GST may include conductive layers 21A to 21C and insulating layers 22 that are alternately stacked. The gate structure GST may further include a hard mask layer 23 disposed on the conductive layers 21A to 21C and the insulating layers 22.

The channel structures CH may pass through the gate structure GST. Each of the channel structures CH may include a memory layer 24, a channel layer 25, an insulating core 26, or a combination thereof. The memory layer 24 may include a blocking layer 24A, a data storage layer 24B, a tunneling layer 24C, or a combination thereof. The isolation structure 27 may be disposed in the gate structure GST between adjacent channel structures CH. The isolation structure 27 may include a first portion P1 and a second portion P2.

The third conductive layer 21C may include a first region R1 and a second region R2. The first region R1 of the third conductive layer 21C may have a first thickness T31, and the second region R2 of the third conductive layer 21C may have a second thickness T32 different from the first thickness T31. The second thickness T32 may be smaller than the first thickness T31.

The first region R1 may be disposed between the stacked insulating layers 22. The channel structures CH may pass through the first region R1. The second region R2 may protrude from a sidewall of the first region R1 toward the isolation structure 27. The second region R2 may surround a sidewall of the second portion P2 of the isolation structure 27. In the first direction I, the second region R2 may be disposed between the second portion P2 of the isolation structure 27 and the channel structure CH. In the third direction III, the second region R2 may be disposed between the insulating layer 22 and the first portion P1 of the isolation structure 27.

According to the structure described above, the first region R1 may surround the partial sidewall of the channel structure CH and the second region R2 may surround the remaining sidewall of the channel structure CH. Accordingly, the third conductive layer 21C may surround the entire surface of the channel structures CH, and operation characteristics of a memory cell or a select transistor using the third conductive layer 21C as a gate electrode may be improved.

Figure 3A:
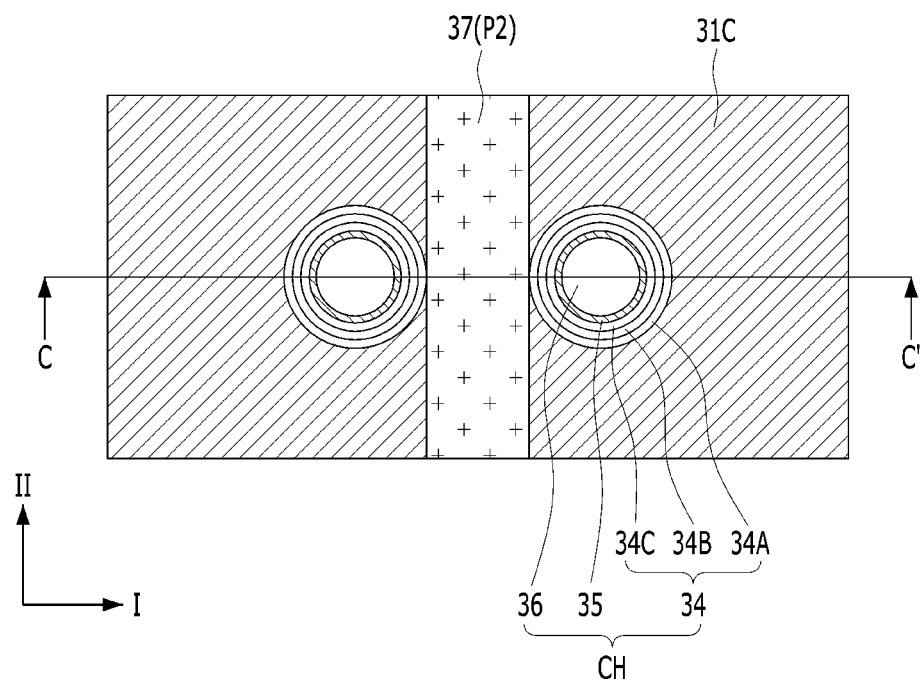
FIG. 3A and FIG. 3B are diagrams illustrating the structure of a semiconductor device in accordance with an embodiment of the present invention disclosure.
Figure 3B:
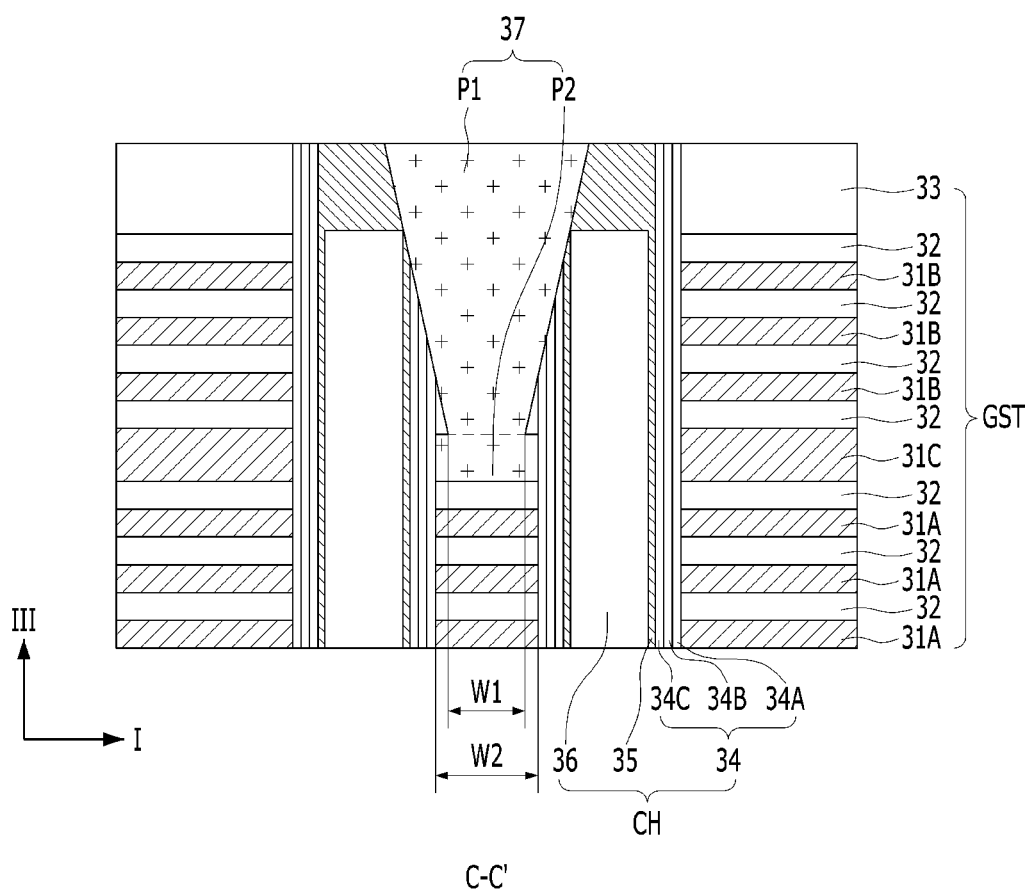

FIG. 3A and FIG. 3B are diagrams illustrating the structure of a semiconductor device according to an embodiment. FIG. 3A is a plan view and FIG. 3B are cross-sectional views taken along line C-C' in FIG. 3A. Hereinafter, content already described may be omitted.

Referring to FIG. 3A and FIG. 3B, the semiconductor device may include a gate structure GST, channel structures CH, an isolation structure 37, or a combination thereof. The gate structure GST may include at least one first conductive layer 31A, at least one second conductive layer 31B, and a third conductive layer 31C disposed between the first conductive layer 31A and the second conductive layer 31B. In an embodiment, the gate structure GST may include conductive layers 31A to 31C and insulating layers 32 that are alternately stacked. The gate structure GST may further include a hard mask layer 33 disposed on the stack of the conductive layers 31A to 31C and the insulating layers 32.

The channel structures CH may pass through the gate structure GST. Each of the channel structures CH may include a memory layer 34, a channel layer 35, an insulating core 36, or a combination thereof. The memory layer 34 may include a blocking layer 34A, a data storage layer 34B, a tunneling layer 34C, or a combination thereof.

The isolation structure 37 may be disposed in the gate structure GST. The isolation structure 37 may include a first portion P1 and a second portion P2. The second portion P2 may be connected to the first portion P1. The second portion P2 may pass through the third conductive layer 31C and may be disposed between the channel structures CH. At an interface between the first portion P1 and the second portion P2, the first portion P1 and the second portion P2 may have the same or substantially the same width (W1=W2) or may have different widths. In an embodiment, the second portion P2 may have a wider width (W2>W1) than the first portion P1.

According to the structure described above, the width of a bottom surface of the isolation structure 37 may be increased by the second portion P2. Accordingly, inclusion of voids in the isolation structure 17 may be minimized or prevented. In addition, damage to a peripheral layer due to residual gas in the voids may be prevented.

FIG. 4A and FIG. 4B, FIG. 5A and FIG. 5B, FIG. 6A and FIG. 6B, FIG. 7A and FIG. 7B, FIG. 8A and FIG. 8B, and FIG. 9A and FIG. 9B are diagrams illustrating a manufacturing method of a semiconductor device in accordance with an embodiment of the present invention disclosure. FIG. 4A, FIG. 5A, FIG. 6A, FIG. 7A, FIG. 8A, and FIG. 9A are plan views, and FIG. 4B, FIG. 5B, FIG. 6B, FIG. 7B, FIG. 8B, and FIG. 9B are sectional views taken along lines C-C' in FIG. 4A, FIG. 5A, FIG. 6A, FIG. 7A, FIG. 8A, and FIG. 9A, respectively. Hereinafter, content already described earlier is be omitted.

Figure 4A:
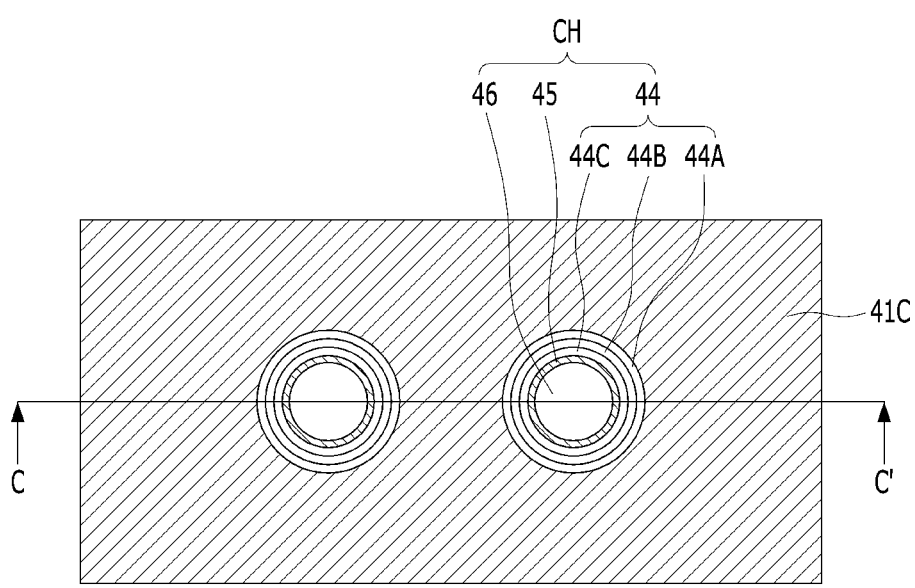
FIG. 4A and FIG. 4B, FIG. 5A and FIG. 5B, FIG. 6A and FIG. 6B, FIG. 7A and FIG. 7B, FIG. 8A and FIG. 8B, and FIG. 9A and FIG. 9B are diagrams illustrating a manufacturing method of a semiconductor device in accordance with an embodiment of the present invention disclosure.
Figure 4B:
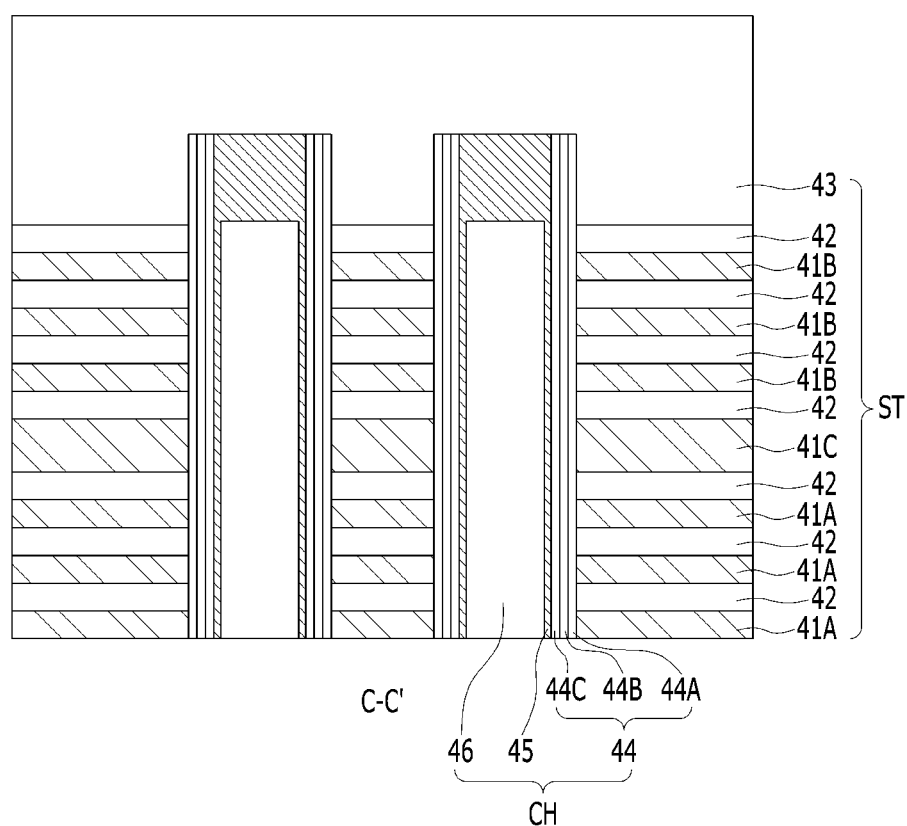

Referring to FIG. 4A and FIG. 4B, a stack ST may be formed. The stack ST may include first material layers 41A, 41B and 41C and second material layers 42 that are alternately stacked. The first material layers 41A, 41B, and 41C may be used to form word lines, bit lines, select lines, and the like, and the second material layers 42 may be used to form insulating layers. The first material layers 41A, 41B, and 41C may each include a material having a high etch selectivity with respect to the second material layers 42. For example, the first material layers 41A, 41B, and 41C may each include a sacrificial material such as a nitride, and the second material layers 42 may each include an insulating material such as an oxide. In another example, the first material layers 41A, 41B, and 41C may each include a conductive material such as polysilicon, tungsten, or molybdenum, and the second material layers 42 may each include an insulating material such as an oxide. For example, the stack ST may further include a hard mask layer 43 disposed on the first material layers 41A, 41B, and 41C and the second material layers 42.

The first material layers 41A, 41B, and 41C may have the same or substantially the same thickness, or may have different thicknesses. In an embodiment, the first material layer 41A may have a first thickness T1, and the first material layer 41B may have a second thickness T2 that is the same or substantially the same as or different from the first thickness T1. The first material layer 41C may have a third thickness T3 greater than the first thickness T1, have a third thickness T3 greater than the second thickness T2, or have a third thickness T3 greater than each of the first thickness T1 and the second thickness T2.

Subsequently, channel structures CH passing through the stack ST may be formed. The channel structures CH may each include a channel layer 45, a memory layer 44 or an insulating core 46, or a combination thereof. The memory layer 44 may further include a blocking layer 44A, a data storage layer 44B, or a tunneling layer 44C, or a combination thereof. The data storage layer 44B may include a floating gate, polysilicon, a charge trap material, nitride, a variable resistance material, or the like. Subsequently, the hard mask layer 43 may be additionally formed on the stack ST. Therefore, it is possible to prevent upper surfaces of the channel structures CH from being exposed in a subsequent process.

Figure 5A:
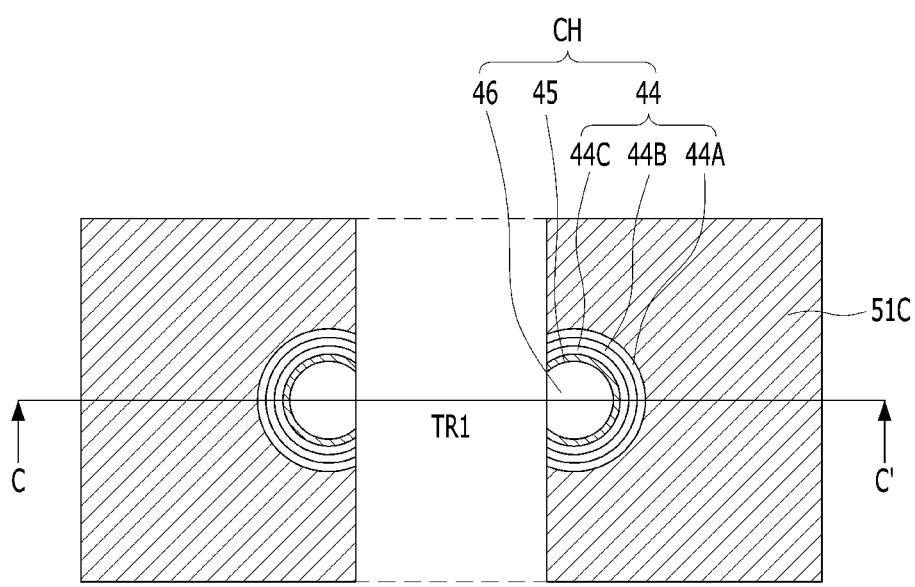
Figure 5B:
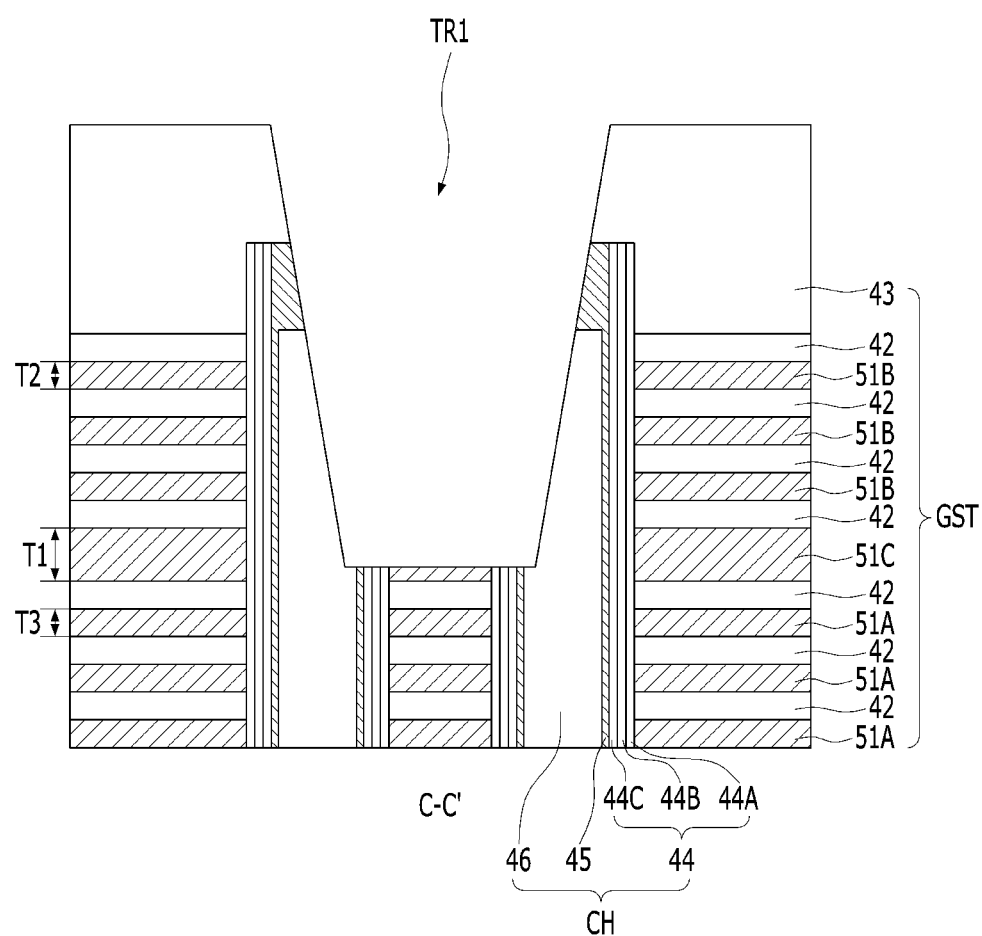

Referring to FIG. 5A and FIG. 5B, a gate structure GST may be formed. In an embodiment, after a slit passing through the gate structure GST is formed, the first material layers 41A, 41B, and 41C may be replaced with conductive layers 51A to 51C, respectively, through the slit. Therefore, the gate structure GST including the conductive layers 51A to 51C and the second material layers 42 that are alternately stacked may be formed. In an embodiment, the gate structure GST may include at least one first conductive layer 51A, at least one second conductive layer 51B, and a third conductive layer 51C.

The first, second, and third conductive layers 51A, 51B, and 51C may have the same or substantially the same thickness or different thicknesses. In an embodiment, the first conductive layer 51A may have a first thickness T1, and the second conductive layer 51B may have a second thickness T2 that is the same or substantially the same as or different from the first thickness T1. The third conductive layer 51C may have a third thickness T3 greater than the first thickness T1, have a third thickness T3 greater than the second thickness T2, or have a third thickness T3 greater than each of the first thickness T1 and the second thickness T2.

For example, when the first material layers 41A, 41B, and 41C each include a conductive material, a silicification process for reducing the resistance of the first material layers 41A, 41B, and 41C may be performed instead of replacing the first material layers 41A, 41B, and 41C with the conductive layers 51A to 51C. Alternatively, it is also possible to use the stack ST as the gate structure GST without an additional process.

Subsequently, a first trench TR1 may be formed in the gate structure GST. In an embodiment, after a mask pattern is formed on the gate structure GST, the gate structure GST may be etched using the mask pattern as an etch barrier to form the first trench TR1. The first trench TR1 may pass through the second conductive layers 51B and expose the third conductive layer 51C on the bottom surface thereof.

Since the third conductive layer 51C has a relatively larger thickness than that of the first conductive layer 51A or the second conductive layer 51B, the third conductive layer 51C may be used as an etch stop layer when the gate structure GST is etched. The third conductive layer 51C may be exposed through the first trench TR1. A surface of the third conductive layer 51C may be exposed through the bottom surface of the first trench TR1. Alternatively, in the process of forming the first trench TR1, the third conductive layer 51C may be partially etched deeply, and the bottom surface of the first trench TR1 may be disposed in the third conductive layer 51C.

When the first trench TR1 is formed, the channel structures CH may be etched. In such a case, the memory layer 44, the channel layer 45, or the insulating core 46 may be exposed through the etched surfaces of the channel structures CH. In an embodiment, the channel layer 45 or the insulating core 46 may be exposed through an inner wall of the first trench TR1, and the memory layer 44 or the third conductive layer 51C may be exposed through the bottom surface of the first trench TR1. For example, depending on the width of the bottom surface of the first trench TR1, only the third conductive layer 51C may be exposed or the memory layer 44 and the insulating core 46 may be further exposed through the bottom surface.

Figure 6A:
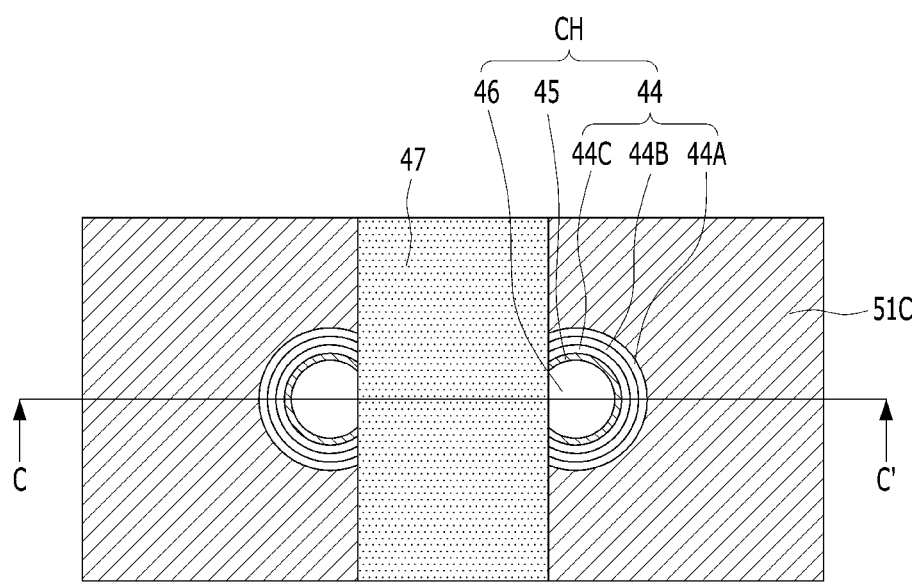
Figure 6B:
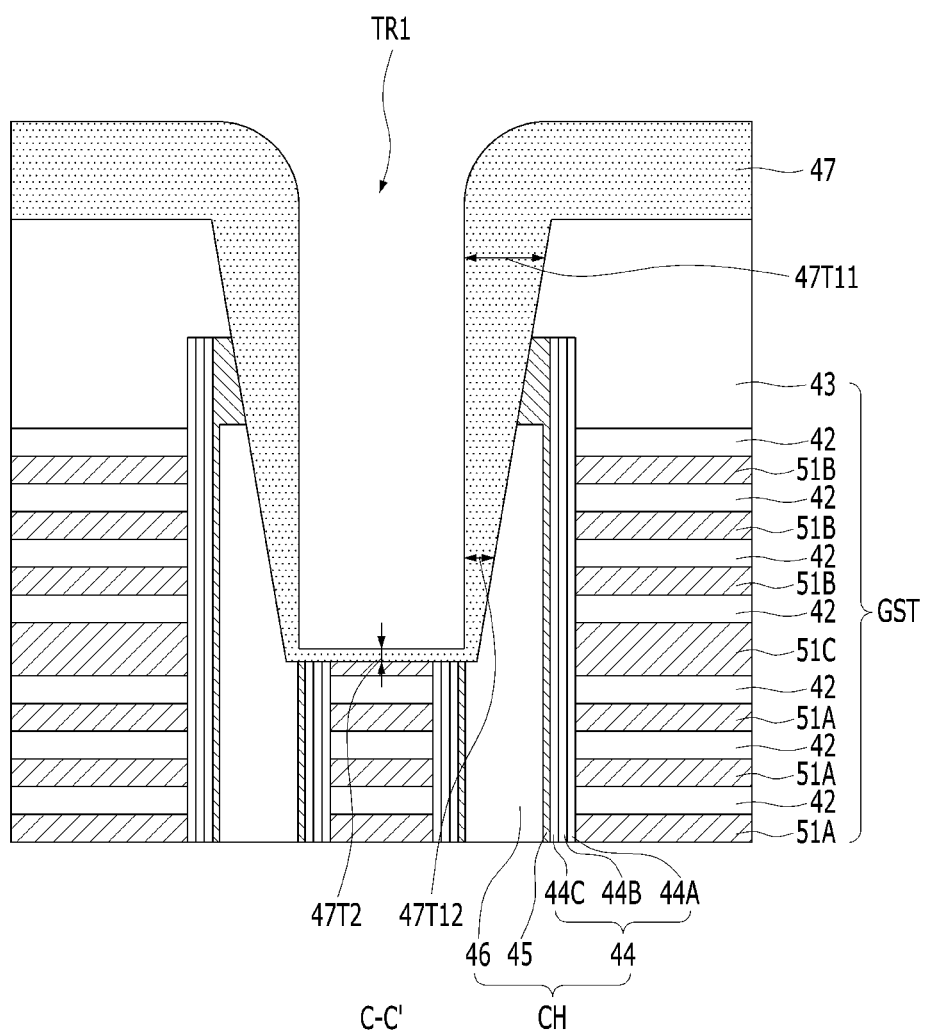

Referring to FIG. 6A and FIG. 6B, an insulating layer 47 may be formed. The insulating layer 47 may be formed by depositing an insulating material along the profile of the first trench TR1. In an embodiment, the insulating layer 47 may be formed along the inner surface of the first trench TR1 and may be extended to the upper surface of the gate structure GST. The insulating layer 47 may include an insulating material such as oxide or nitride.

The insulating layer 47 may have a variable thickness changing, for example, gradually along its extent. When the insulating layer 47 is formed by depositing an insulating material, the insulating material may be deposited with a relatively small thickness at a lower portion of the first trench and may be deposited with a relatively large thickness at an upper portion of the first trench. The insulating layer 47 may have a tapered cross-section. The insulating layer 47 may have a smaller thickness than the inner wall at the bottom surface of the first trench TR1. In an embodiment, an inner wall thickness 47T12 of the insulating layer 47 at the lower portion thereof may be smaller than an inner wall thickness 47T11 of the insulating layer 47 at the upper portion thereof (47T12<47T11). A thickness 47T2 of the insulating layer 47 at the bottom surface of the first trench TR1 may be smaller than the inner wall thickness 47T12 of the insulating layer 47 at the lower portion thereof (47T2<47T12).

Figure 7A:
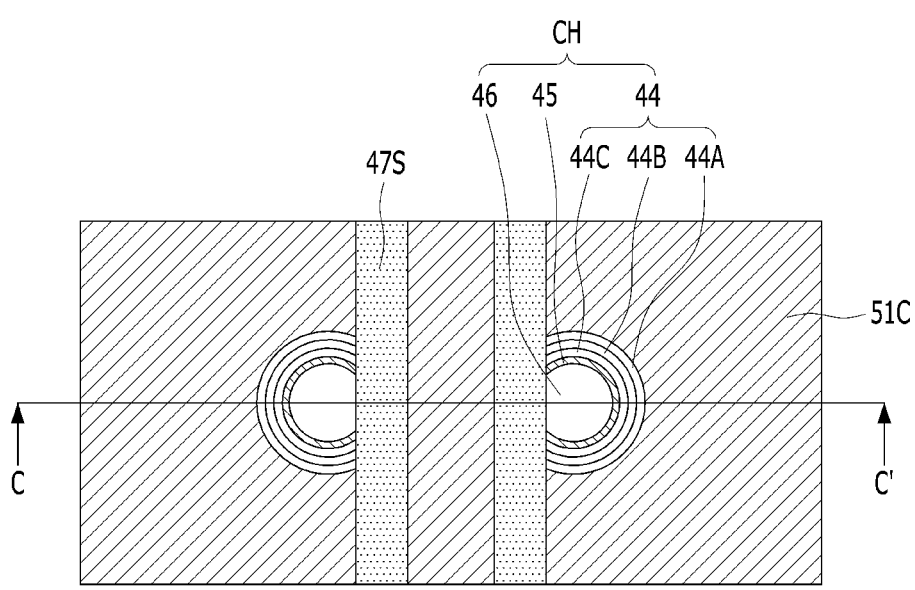
Figure 7B:
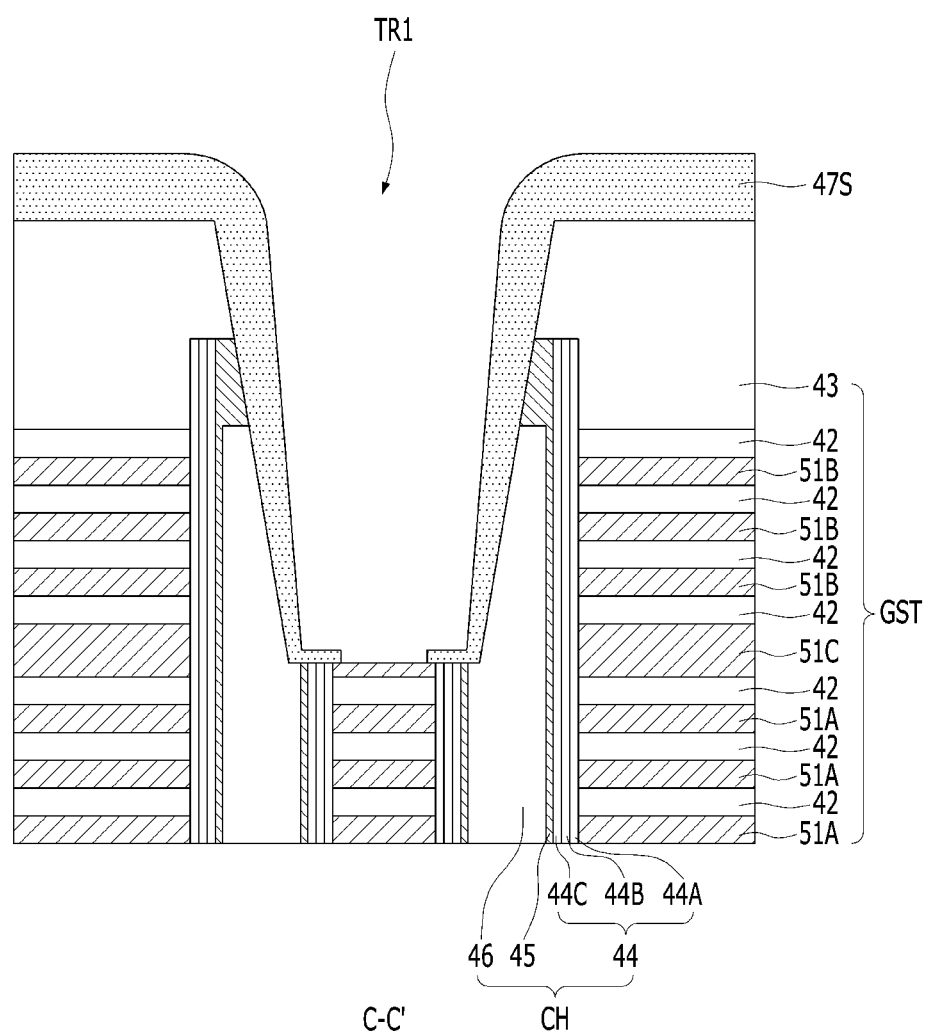

Referring to FIG. 7A and FIG. 7B, an insulating spacer 47S may be formed on the inner wall of the first trench TR1. In an embodiment, the insulating spacer 47S for exposing the third conductive layer 51C may be formed by etching the entire surface of the insulating layer 47. Since the insulating layer 47 has a variable thickness changing, for example, gradually along its extent, a portion of the insulating layer 47 having a relatively small thickness may be removed by an etching process. In an embodiment, a portion of the insulating layer 47 formed on the bottom surface of the first trench TR1 may be removed, so that the third conductive layer 51C may be exposed.

Figure 8A:
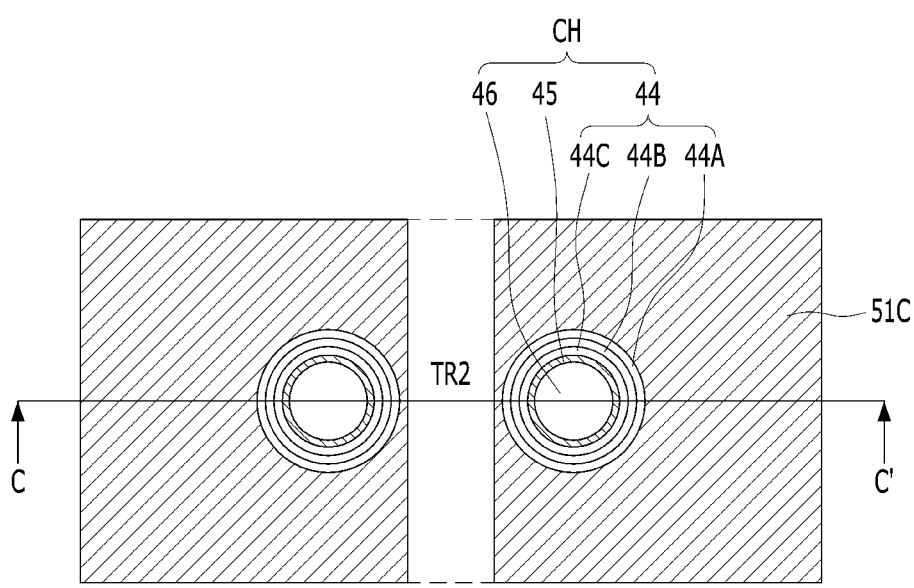
Figure 8B:
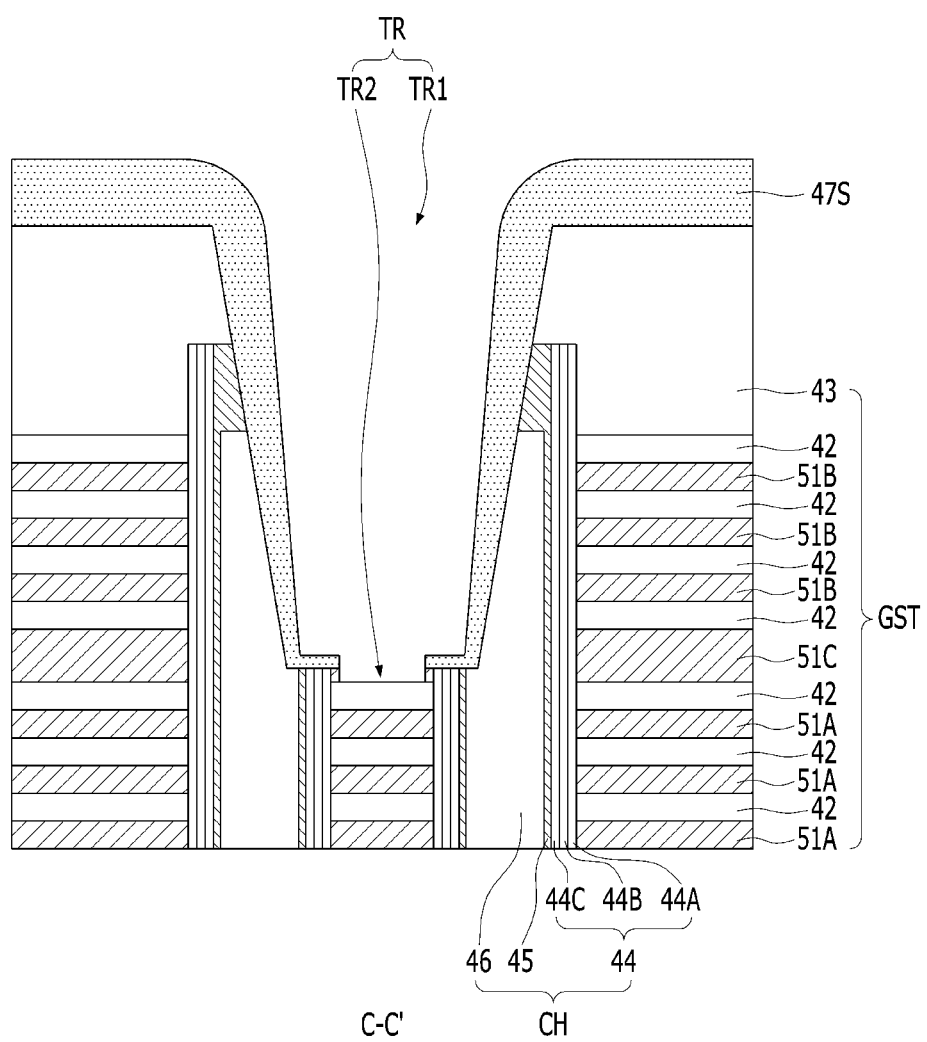

Referring to FIG. 8A and FIG. 8B, a second trench TR2 may be formed. Therefore, a trench TR including the first trench TR1 and the second trench TR2 may be formed. As the first trench TR1 and the second trench TR2 having different widths are connected to each other, the trench TR may have a stepped shape on the bottom surface thereof.

In an embodiment, the third conductive layer 51C exposed through the first trench TR1 is selectively etched. Therefore, the second trench TR2 in which the first trench TR1 is extended into the gate structure GST may be formed. The second trench TR2 may be connected to the first trench TR1 and may be disposed between the channel structures CH. When the second trench TR2 is formed, the amount of the third conductive layer 51C etched may be adjusted according to etching conditions. Accordingly, the third conductive layer 51C may or may not remain on a lower portion of the insulating spacer 47S. When the third conductive layer 51C is etched, the insulating spacer 47S may be used as an etch barrier. Therefore, it is possible to prevent the gate structure GST or the channel structures CH from being damaged in the process of forming the second trench TR2.

Figure 9A:
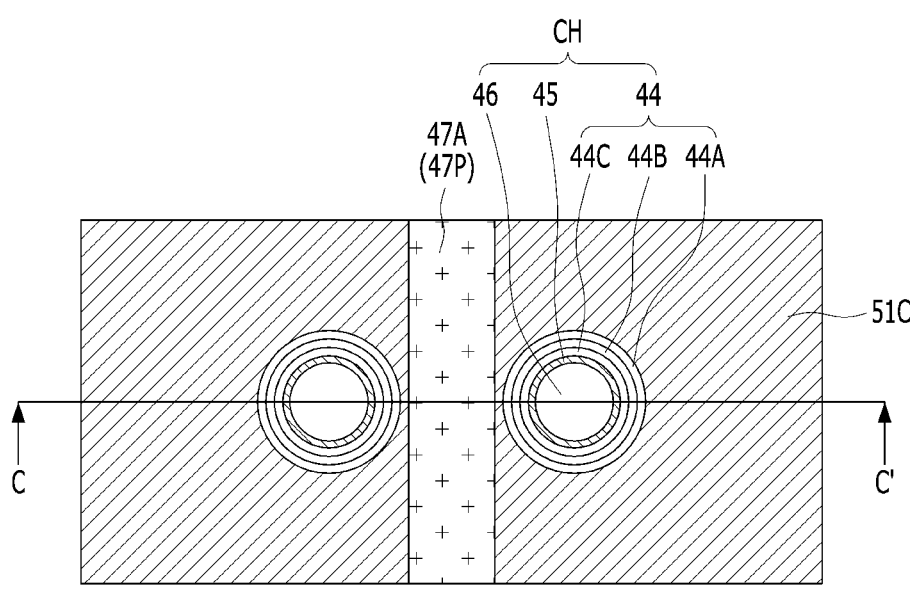
Figure 9B:
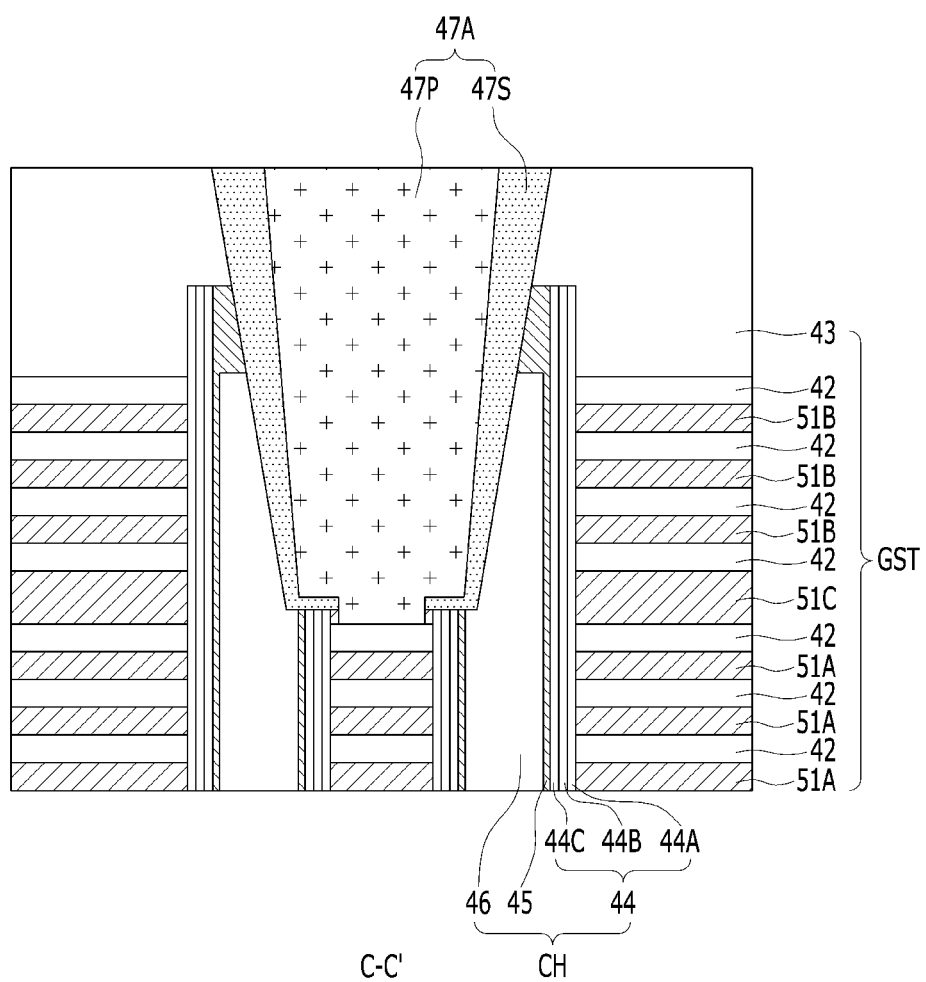

Referring to FIG. 9A and FIG. 9B, an isolation structure 47A may be formed in the first trench TR1 and the second trench TR2. In an embodiment, after the first trench TR1 and the second trench TR2 are filled by depositing an insulating material, the insulating material and the insulating spacer 47S are planarized until the surface of the hard mask layer 43 is exposed, and an insulating pattern 47P may be formed. Since the insulating material is deposited in a state in which the area of the bottom surface is secured by the second trench TR2, generation of voids in the first trench TR1 or the second trench TR2 may be minimized or prevented. The insulating pattern 47P may include an insulating material such as an oxide layer or a nitride layer. For example, it is also possible to remove the insulating spacer 47S before the insulating pattern 47P is formed.

The isolation structure 47A may include a first portion formed in the first trench TR1 and a second portion formed in the second trench TR2. The first portion may be extended into the channel structures CH, and the second portion may be disposed between the channel structures CH. The isolation structure 47A may have a step-shaped cross-section on the bottom surface thereof by reflecting the connection shape of the first trench TR1 and the second trench TR2.

Although the method of forming the first trench TR1 in the gate structure GST has been described in the present embodiment, it is also possible to form the first trench TR1 in the stack ST. In such a case, the first trench TR1 may be formed using the first material layer 41C having a relatively large thickness as an etch stop layer. The first trench TR1 may pass through the first material layers 41B and expose the first material layer 41C. Subsequently, the first material layer 41C may be selectively etched to form the second trench TR2. Subsequently, after the isolation structure 47A is formed in the first trench TR1 and the second trench TR2, an additional process such as replacing the first material layers 41A, 41B, and 41C with conductive layers may be performed.

According to the manufacturing method described above, the first trench TR1 may be formed using the third conductive layer 51C as an etch stop layer, which makes it possible to form the first trench TR1 having a uniform depth. By forming the second trench TR2 connected to the first trench TR1, the bottom surface of the first trench TR1 may be extended. Furthermore, by forming the insulating spacer 47S, damage to a peripheral layer during the manufacturing process may be minimized or prevented.

FIG. 10A and FIG. 10B, FIG. 11A and FIG. 11B, and FIG. 12A and FIG. 12B are diagrams illustrating a manufacturing method of a semiconductor device in accordance with an embodiment of the present invention disclosure.

Figure 10A:
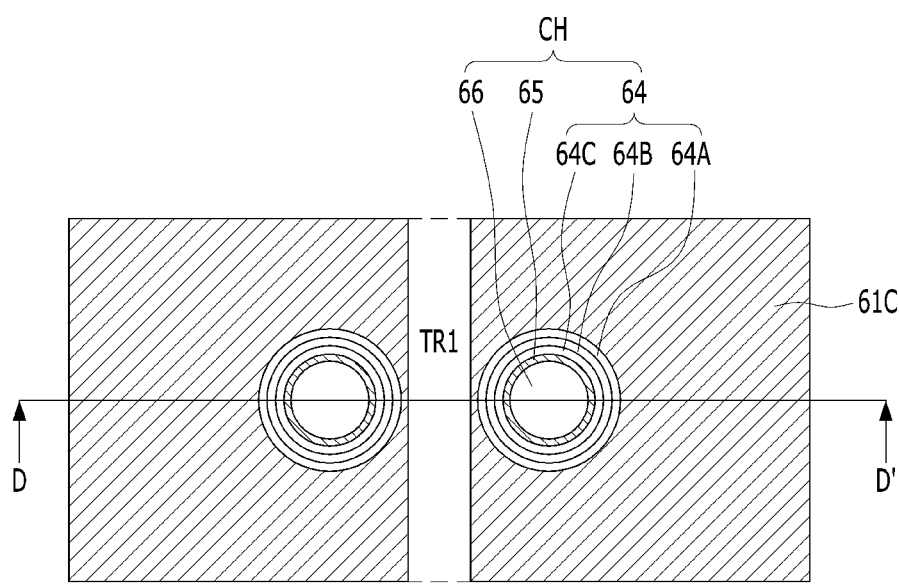
FIG. 10A and FIG. 10B, FIG. 11A and FIG. 11B, and FIG. 12A and FIG. 12B are diagrams illustrating a manufacturing method of a semiconductor device in accordance with an embodiment of the present invention disclosure.
Figure 10B:
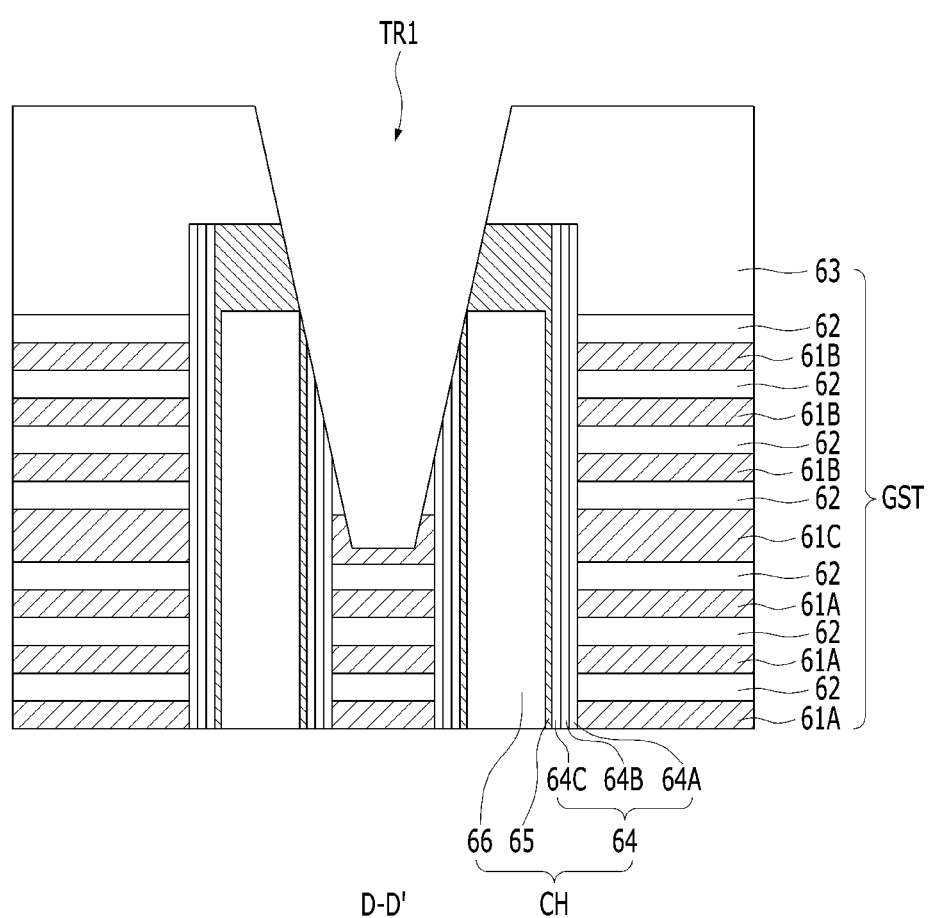
Figure 11A:
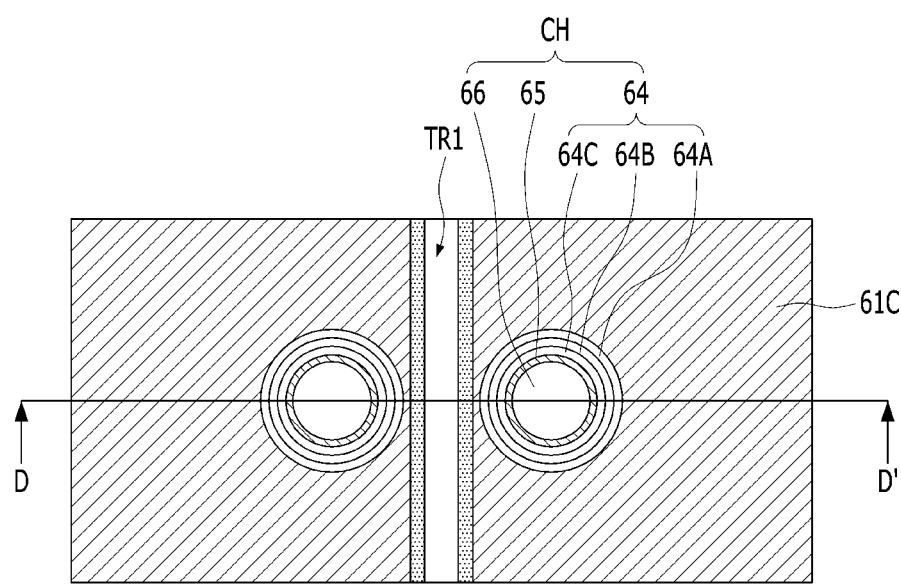
Figure 11B:
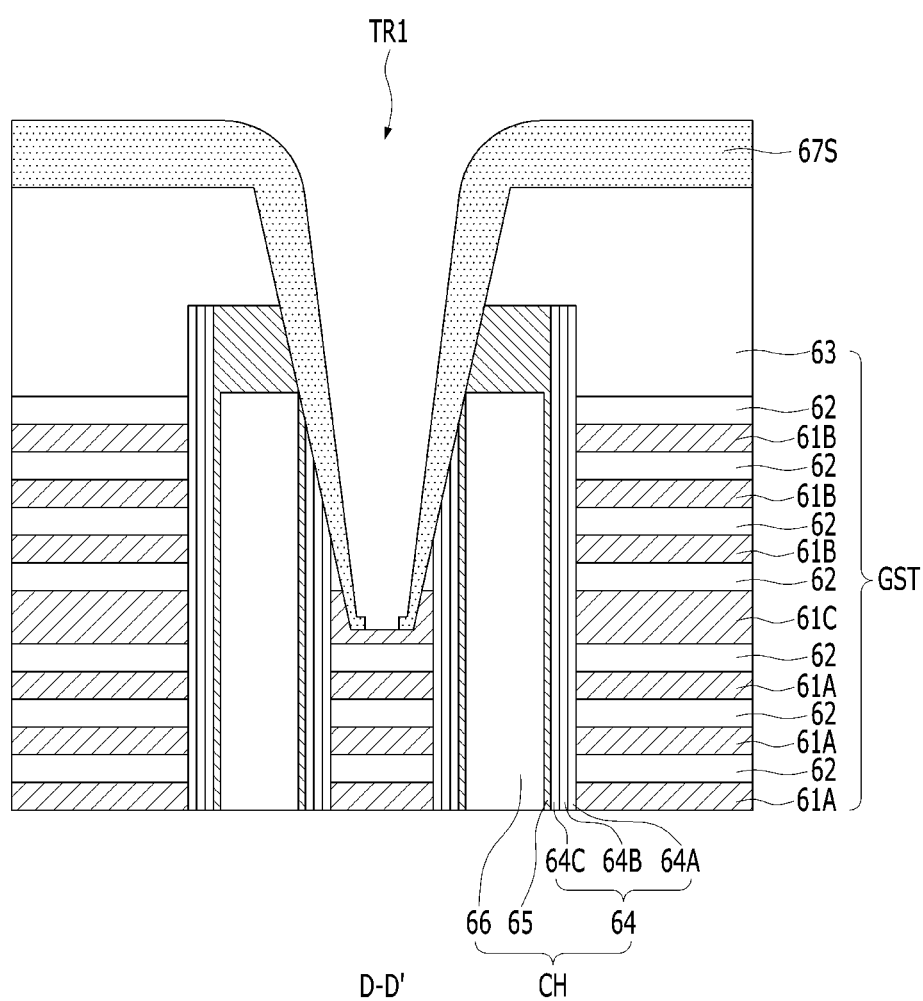
Figure 12A:
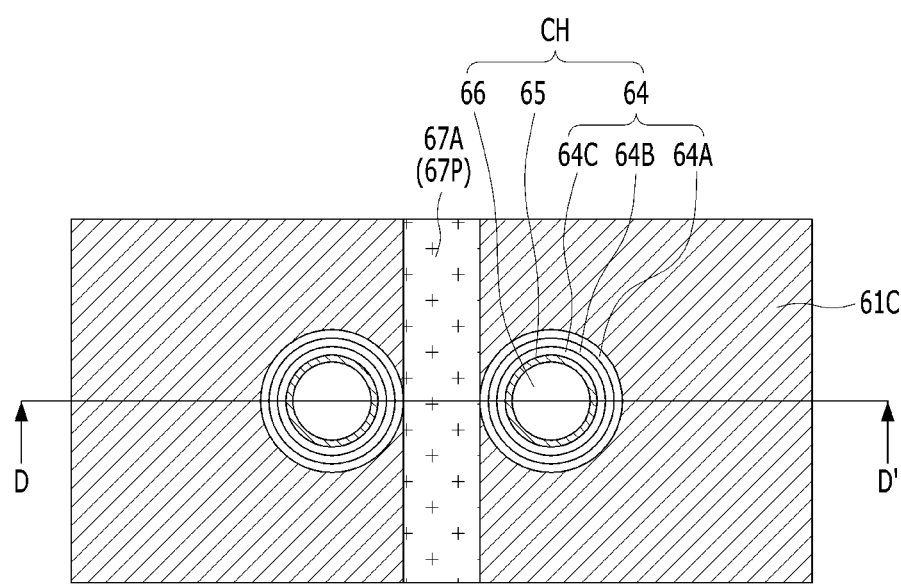
Figure 12B:
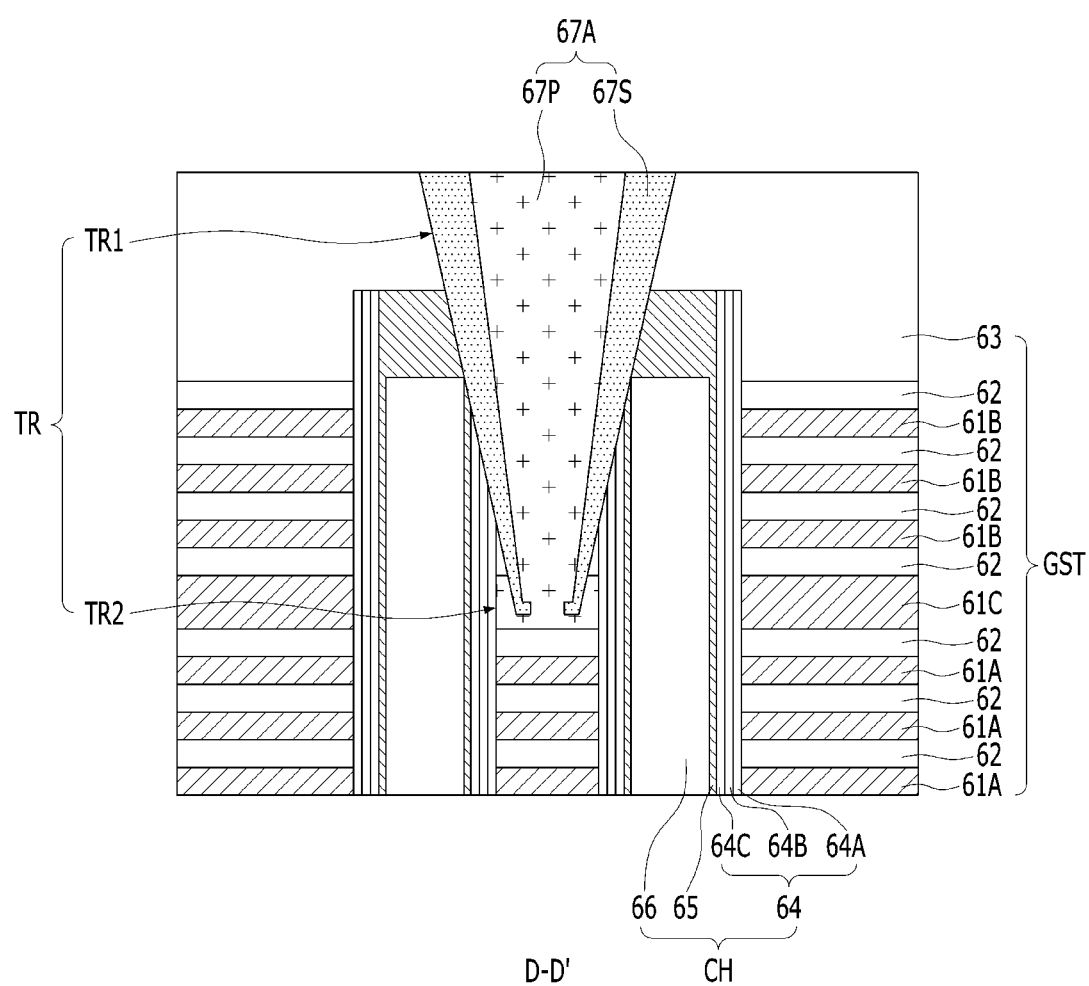

FIG. 10A, FIG. 11A, and FIG. 12A may be plan views, and FIG. 10B, FIG. 11B, and FIG. 12B may be sectional views taken along lines D-D' in FIG. 10A to FIG. 12A, respectively. Hereinafter, content overlapping the previously described content may be omitted.

Referring to FIG. 10A and FIG. 10B, a gate structure GST and a channel structure CH may be formed. In an embodiment, after a stack including first material layers and second material layers 62 alternately stacked is formed, the channel structure CH may be formed. Subsequently, the gate structure GST may be formed by replacing the first material layers with conductive layers 61A to 61C. The gate structure GST may include at least one first conductive layer 61A, at least one second conductive layer 61B, and a third conductive layer 61C, and may further include a hard mask layer 63. The channel structures CH may each include a channel layer 65, a memory layer 64, an insulating core 66, or a combination thereof. The memory layer 64 may further include a blocking layer 64A, a data storage layer 64B, a tunneling layer 64C, or a combination thereof.

Subsequently, a first trench TR1 may be formed in the gate structure GST. In an embodiment, the first trench TR1 may be formed by etching the gate structure GST and the channel structures CH. The first trench TR1 may be extended into the channel structures CH and may pass through the second conductive layers 61B. The channel structures CH may be exposed through an inner wall of the first trench TR1, and the third conductive layer 61C may be exposed through a bottom surface of the first trench TR1. When the gate structure GST is etched, the third conductive layer 61C may be used as an etch stop layer.

Referring to FIG. 11A and FIG. 11B, an insulating spacer 67S may be formed on the inner wall of the first trench TR1. The insulating spacer 67S may protect the second conductive layers 61B and the channel structures CH exposed through the inner wall of the first trench TR1, and may expose the third conductive layer 61C.

Referring to FIG. 12A and FIG. 12B, a second trench TR2 may be formed by etching the third conductive layer 61C using the insulating spacer 67S as an etch barrier. The second trench TR2 may have a greater width than the first trench TR1. Therefore, even though the bottom surface of the first trench TR1 is formed to have a relatively narrow width, the width of the bottom of the trench TR may be sufficiently secured by the second trench TR2.

Subsequently, an isolation structure 67A may be formed in the first trench TR1 and the second trench TR2. In an embodiment, an insulating pattern 67P may be formed by depositing an insulating material. Since the insulating material is deposited in a state in which the width of the bottom surface of the trench TR is sufficiently secured by the second trench TR2, generation of voids in the first trench TR1 or the second trench TR2 may be minimized or prevented. The isolation structure 67A may have a shape in which the width of the bottom surface thereof is extended by reflecting the connection shape of the first trench TR1 and the second trench TR2. For example, it is also possible to remove the insulating spacer 67S before the insulating pattern 67P is formed.

According to the manufacturing method described above, the first trench TR1 may be formed using the third conductive layer 51C as an etch stop layer, which makes it possible to form the first trench TR1 having a uniform depth. By forming the second trench TR2 connected to the first trench TR1, the width of the bottom surface of the first trench TR1 may be extended. Furthermore, by forming the insulating spacer 47S, damage to a peripheral layer during the manufacturing process may be minimized or prevented.

Although embodiments according to the technical idea of the present invention disclosure have been described above with reference to the accompanying drawings, this is only for explaining the embodiments according to the concepts of the present invention disclosure, and the present invention disclosure is not limited to the above embodiments. Various types of substitutions, modifications, and changes for the embodiments may be made by those skilled in the art, to which the present invention disclosure pertains, without departing from the technical idea of the present invention disclosure defined in the following claims, and it should be construed that these substitutions, modifications, and changes belong to the scope of the present invention disclosure.

What is claimed is:

1. A semiconductor device comprising:
    a gate structure including a first conductive layer, a second conductive layer, and a third conductive layer, the third conductive layer being disposed between the first conductive layer and the second conductive layer and thicker than the first conductive layer and the second conductive layer;
    channel structures passing through the gate structure; and
    an isolation structure including a first portion passing through the second conductive layer and extended into the channel structures and a second portion protruding from the first portion into the third conductive layer and disposed between neighboring channel structures.

2. The semiconductor device of claim 1, wherein the isolation structure passes through the third conductive layer.

3. The semiconductor device of claim 1, wherein the isolation structure comprises:
    an insulating pattern passing through the second conductive layer and the third conductive layer; and
    an insulating spacer disposed between the insulating pattern and the channel structure.

4. The semiconductor device of claim 3, wherein the insulating spacer surrounds etched surfaces of the channel structures.

5. The semiconductor device of claim 1, wherein the second portion has a narrower width than the first portion.

6. The semiconductor device of claim 1, wherein the second portion has a wider width than the first portion at a boundary of the first portion and the second portion.

7. The semiconductor device of claim 1, wherein, in the isolation structure, a sidewall of the first portion has a first inclination and a sidewall of the second portion has a second inclination different from the first inclination.

8. The semiconductor device of claim 1, wherein a bottom surface of the second portion and a bottom surface of the third conductive layer are disposed on the same or substantially the same plane.

9. The semiconductor device of claim 1, wherein each of the channel structures comprises a channel layer, a memory layer surrounding a sidewall of the channel layer, and an insulating core in the channel layer, and the first portion is in contact with the channel layer or the insulating core.

10. The semiconductor device of claim 1, wherein the third conductive layer includes a first region having a first thickness and a second region surrounding a sidewall of the second portion and having a second thickness smaller than the first thickness.

11. The semiconductor device of claim 1, wherein the first conductive layer is a word line, and the second conductive layer and the third conductive layer are select lines.

12. The semiconductor device of claim 1, wherein the second portion protrudes from a lower surface of the first portion.

13. A semiconductor device comprising:
a gate structure including a first conductive layer, a second conductive layer and a third conductive layer, the third conductive layer being disposed between the first conductive layer and the second conductive layer, wherein the third conductive layer is thicker than the first conductive layer and the second conductive layer;
a channel structure passing through the gate structure and including an etched surface; and
an isolation structure including an insulating pattern passing through the second conductive layer and the third conductive layer, and an insulating spacer disposed between the etched surface of the channel structure and the insulating pattern.

14. The semiconductor device of claim 13, wherein a bottom surface of the isolation structure and a bottom surface of the third conductive layer are disposed on the same or substantially the same plane.

15. The semiconductor device of claim 13, wherein the insulating pattern includes a first portion passing through the second conductive layer and extended into the channel structure and a second portion protruding from the first portion into the third conductive layer.

16. The semiconductor device of claim 15, wherein the second portion has a narrower width than the first portion.

17. The semiconductor device of claim 15, wherein the second portion has a wider width than the first portion at a boundary of the first portion and the second portion.

18. The semiconductor device of claim 15, wherein the third conductive layer includes a first region having a first thickness and a second region surrounding a sidewall of the second portion and having a second thickness smaller than the first thickness.

19. The semiconductor device of claim 15, wherein the second portion protrudes from a lower surface of the first portion.

* * * * *